United States Patent
Yang et al.

(10) Patent No.: US 7,473,989 B2
(45) Date of Patent: Jan. 6, 2009

(54) FLIP-CHIP PACKAGE

(75) Inventors: Chaur-Chin Yang, Tainan (TW); Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/648,237

(22) Filed: Aug. 27, 2003

(65) Prior Publication Data
US 2005/0046039 A1 Mar. 3, 2005

(51) Int. Cl.
*H01L 23/02* (2006.01)
(52) U.S. Cl. ...................................... 257/678
(58) Field of Classification Search ................. 257/678, 257/684, 778, 686
See application file for complete search history.

(56) References Cited

U.S. PATENT DOCUMENTS 5,583,377 A * 12/1996 Higgins, III ................ 257/707
6,424,034 B1 * 7/2002 Ahn et al. .................... 257/723
6,573,609 B2 * 6/2003 Fjelstad et al. ............... 257/778
6,621,169 B2 * 9/2003 Kikuma et al. .............. 257/780
6,765,152 B2 * 7/2004 Giri et al. .................... 174/260
2003/0164556 A1 * 9/2003 Jiang et al. ................... 257/787
2004/0035840 A1 * 2/2004 Koopmans ................... 219/209
2004/0145051 A1 * 7/2004 Klein et al. .................. 257/734

FOREIGN PATENT DOCUMENTS

CN 457664 10/2001
CN 489496 6/2002

* cited by examiner

Primary Examiner—Kiesha L Rose
(74) Attorney, Agent, or Firm—Troxell Law Office, PLLC

(57) ABSTRACT

A flip-chip package comprises a substrate with an opening. A dummy die is disposed onto the substrate corresponding to the opening so as to form a composite chip carrier with a chip cavity. The dummy die has a redistribution layer which includes a plurality of flip-chip pads for flip-chip connection of a chip and a plurality of connecting pads around the dummy die for connecting the substrate. The dummy die mounts at least a chip by flip chip connection for being an electrical interface medium between the chip and the substrate in order to achieve thinner package thickness, high heat dissipation, fine pitch flip-chip mounting and eliminating flip-chip stress on the chip.

14 Claims, 2 Drawing Sheets

FLIP-CHIP PACKAGE

FIELD OF THE INVENTION

The present invention is generally relating to a flip-chip package, particularly to a flip-chip package comprising a chip carrier consisted of a dummy die and a substrate with an opening.

BACKGROUND OF THE INVENTION

In a conventional flip-chip package, a IC chip with a plurality of bumps is directly flip-chip mounted on a substrate, such as a printed circuit board or ceramic circuit board. A conventional flip-chip package had been brought up from R.O.C. (Republic Of China, Taiwan) Patent No. 457664 entitled "directly-downset flip-chip semiconductor package and its manufacturing process". A chip is flip-chip mounted onto a substrate with a chip-cavity. The chip cavity of the substrate forms a plurality of dimple bonding pads for bonding the bumps of the chip. Due to the different thermal expansion coefficient between the chip and the substrate, the flip-chip mounting region (i.e. bumps) of the chip bears considerable thermal stress so that a warpage or bump-breaking easily takes place on the substrate.

In order to solve the problem of warpage on the substrate caused by thermal stress, a flip chip package had been disclosed in R.O.C. Patent No. 489,496 that a filling compound with a larger coefficient of thermal expansion (CTE) than that of the substrate is coated around the flip-chip region of the substrate for lessening substrate warpage of flip-chip package. But the chip is still directly flip-chip mounted on the substrate, such as ceramic or printed circuit board. The stress still exists at the chip. Flip-chip pads formed on the substrate are critical to match the fine pitch bumps of flip chip, and also the entire flip chip package has a thicker thickness.

SUMMARY

A primary object of the present invention is to provide a flip-chip package with a dummy die. The dummy die without any electrically calculating function is mounted to a substrate having an opening to constitute a chip carrier with a chip cavity. The dummy die has a surface with a redistribution layer (RDL) for electrically connecting a flip-chip mounting type chip and the substrate so as to achieve fine pitch flip-chip mounting, thinner flip chip package and eliminating stress at the flip-chip mounting type chip.

A second object of the present invention is to provide a flip-chip package. The flip-chip package comprises a chip carrier which consists of a dummy die and a substrate with opening. The dummy die without any electrically calculating function but has a surface possessing a redistribution layer for flip-chip mounting a chip. A chip cavity of the chip carrier is formed by the surface of the dummy die and the opening of the substrate, and the dummy die becomes an electrical interface medium between a chip mounted on the dummy chip and the substrate, so that the failure of directly flip-chip mounting die to substrate will be abated. Fine pitch flip-chip mounting, thinner flip-chip package and high heat dissipation are able to be achieved.

A third object of the present invention is to provide a chip carrier for flip-chip package. The chip carrier consists of a substrate with opening and a dummy die with a redistribution layer. A surface of the dummy die with the redistribution layer is attached on the opening of the substrate to form a chip cavity of the chip carrier for flip-chip connection of a chip.

In accordance with the flip-chip package of the present invention, the flip-chip package comprises a substrate, a dummy die, at least a chip and a packaging body. The substrate has a top surface, a bottom surface and an opening passing through the top and bottom surface, such as printed circuit board, which has an unmatched coefficient of thermal expansion (larger) with that of the chip. The dummy die has a surface with a redistribution layer electrically connected to the substrate. It is preferable that the surface of the dummy die is bonded on the bottom surface of the substrate corresponding to the opening. The dummy die and the substrate are assembled to form a composite chip carrier with a chip cavity. The chip is flip-chip mounted on the surface of the dummy die inside the chip cavity and electrically connected to the substrate through the redistribution layer of the dummy die. The packaging body is formed in the opening of the substrate.

DETAILED DESCRIPTION OF THE PRESENT INVENTION

Figure 1:
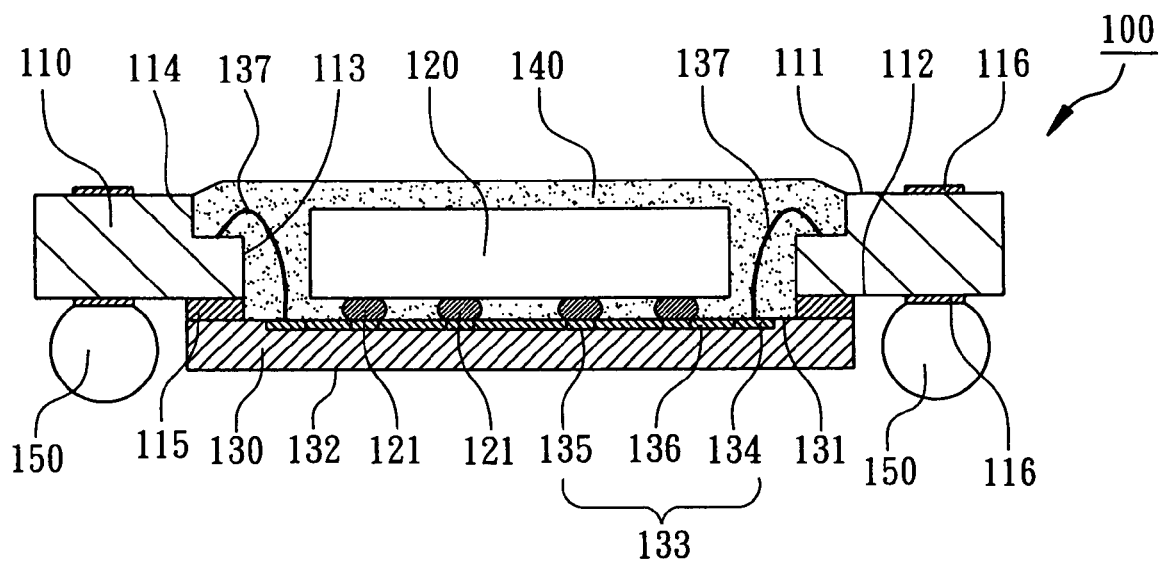
FIG. 1 is a cross-sectional view illustrating a flip-chip package in accordance with a first embodiment of the present invention.

According to the first embodiment shown in FIG. 1, a flip-chip package 100 comprises a substrate 110, a chip 120, a dummy die 130 and a packaging body 140. The substrate 110 can be a printed circuit board made from BT resin, FR-4 resin or FR-5 resin. The substrate 110 possesses a top surface 111, a bottom surface 112 and an opening 113 passing through the top surface 111 and the bottom surface 112. It is preferable that the substrate 110 is a build-up multi-layer printed circuit board so as to have a stair 114 around the opening 113.

Figure 2:
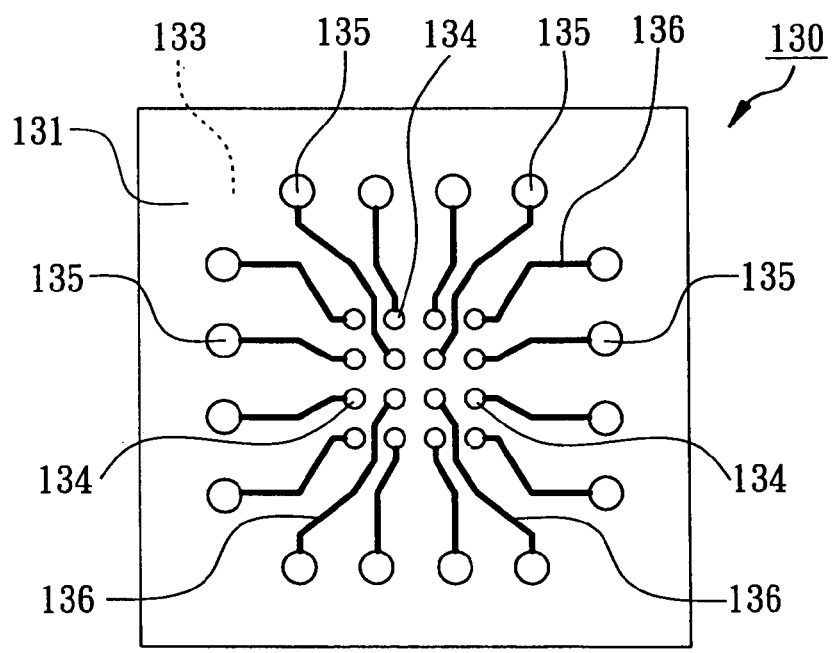
FIG. 2 is a top view illustrating a dummy die of a flip-chip package in accordance with the first embodiment of the present invention.

The dummy die 130 is disposed on the bottom surface 112 of the substrate 110 corresponding to the opening 113. In this embodiment, the dummy die 130 which thickness is about 200 μm (micro meter) has a surface 131 with a redistribution layer 133 (RDL) and a corresponding exposed surface 132. The surface 131 of the dummy die 130 is attached onto the bottom surface 112 of the substrate 110 by means of an adhesive tape 115 in order to form a composite chip carrier with a chip cavity. The chip cavity is formed by the surface 131 of the dummy die 130 and the opening 113 of the substrate 110 for accommodating the chip 120. The dummy die 130 is a silicon substrate without any electrically calculating function or is a substrate with the same or similar CTE as the chip 120. The redistribution layer 133 is formed by an integrated circuit manufacturing process. As shown in FIG. 1 and FIG. 2, the redistribution layer 133 includes a plurality of flip-chip pads 134 for flip-chip connection of the chip 120 and a plurality of connecting pads 135 arraying around the surface 131 of the dummy die 130. Each of the flip-chip pads 134 and corresponding connecting pads 135 are connected by an integrated circuit trace 136. The pitch of the flip-chip pads 132 is smaller than that of the connecting pads 135. Since the redistribution layer 133 may be manufactured by utilizing sputtering and photolithography of integrated circuit manufacturing technique. Firstly a metal layer is formed on the surface 131 of the dummy die 130 by means of sputtering, then the flip-chip pads 134, the connecting pads 135 and the integrated circuit 136 are formed after forming photoresist, exposing, developing and etching. It is better to add a passivation layer (not shown in the drawing) on the surface 131 of the dummy die 130 for coating the integrated circuit traces 136 and exposing the flip-chip pads 134 and the connecting pads 135. Therefore, the pitch of the flip-chip pads 134 may not be larger than 150 μm, even may reach 70~90 μm or more closely. Furthermore, the connecting pads 135 on the dummy die 130 are electrically connected with the substrate 110 (pads on the stair 114) by electrically connecting elements, such as bonding wires 137 or TAB leads so that wire-bonding height is lowered to thin the entire package thickness.

The chip 120 is a IC chip with electrically calculating function, such as microprocessor, microcontroller, memory or ASIC. The chip 120 is flip-chip mounted onto the substrate 131 of the dummy die 130 inside the chip cavity (opening 113). The chip 120 has an active surface forming a plurality of bumps 121, and the chip 120 is smaller than the dummy die 130 in size. By means of flip-chip mounting (or called C4) technique, the bumps 121 of the chip 120 are bonded to the flip-chip pads 132 of the redistribution layer 131. Both the dummy die 130 and the chip 120 have the similar coefficient of thermal expansion so that the bumps 121 of the chip 120 won't be influenced by the thermal stress for eliminating the flip-chip stress of the chip 120.

Besides, the packaging body 140 is formed in the opening 113 of the substrate 110 to protect the chip 120 by dispensing or molding. In this embodiment, the packaging body 140 can be formed as thin as possible by dispensing liquid compound into the opening 113. Furthermore, the flip-chip package further comprises a plurality of solder balls 150 planted on the bottom surface 112 of the substrate 110, or the top surface 111 of the substrate 110 according to another different design of the substrate 110. The flip-chip pads 134 of the dummy die 130 made by the integrated circuit manufacturing process can match the bumps 121 high density arranged on the chip 120. The dummy die 130 is used to become an electrical interface medium between the chip 120 and the substrate 110 for avoiding the failure of directly flip-chip mounting the chip 120 to the substrate 110 and reaching fine pitch of flip-chip mounting. By means of assembling the dummy die 130 and the substrate 110 to a chip carrier, the flip-chip package 100 is able to be thinned substantially.

Figure 3:
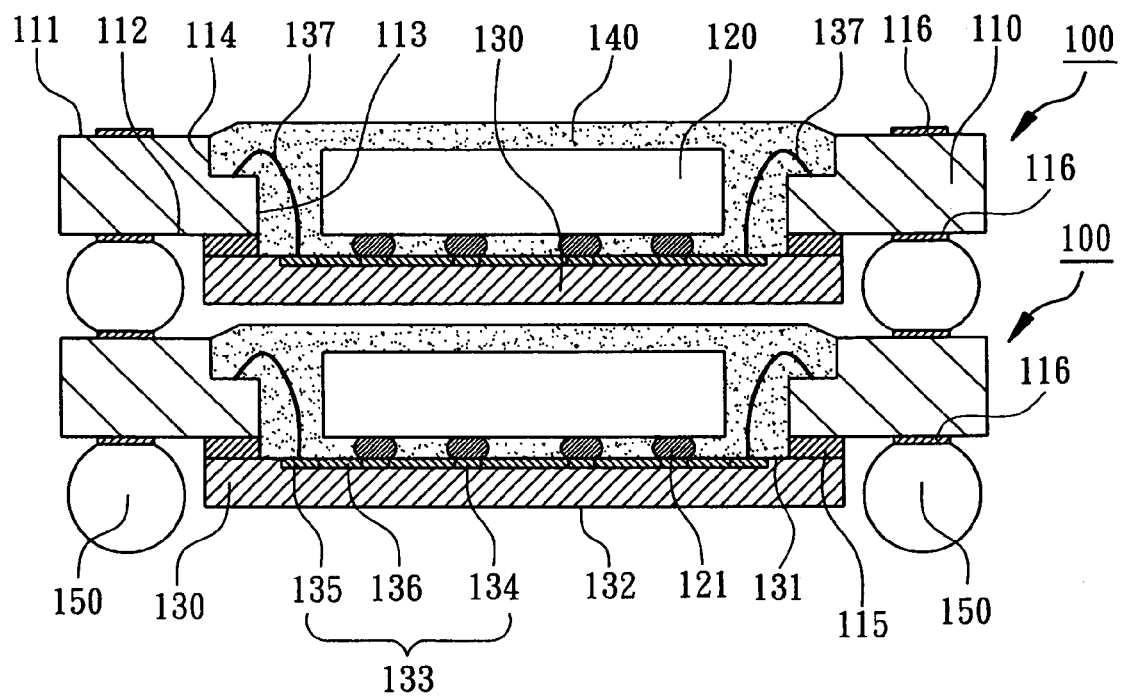
FIG. 3 is a cross-sectional view illustrating stacked multiple flip-chip packages in accordance with the first embodiment of the present invention.

Moreover, as shown in FIG. 3, in another embodiment the substrate 110 has a plurality of connection pads 116 on the upper surface 111. The connection pads 116 are electrically connected with the solder ball 150 by internal multi-layer wiring design of the substrate 110. Thus a plurality of flip-chip packages 100 can be stacked vertically by connecting the solder ball 150 of an upper flip-chip packages 100 with the connection pads 116 of an lower flip-chip packages 100. Thus the connection pads 116 of the substrate 110 are provided for connecting outer terminals of a stack semiconductor package in supper thin configuration.

Figure 4:
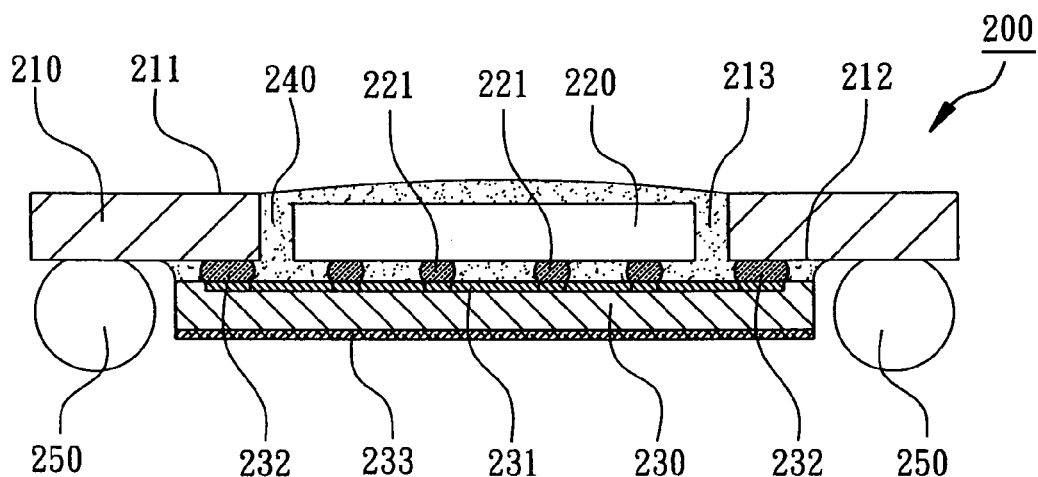
FIG. 4 is a cross-sectional view illustrating a flip-chip package in accordance with a second embodiment of the present invention.

In the second embodiment of the present invention, another flip-chip package 200 is illustrated in FIG. 4. The flip-chip package 200 comprises a semiconductor chip 220 and a composite chip carrier composed of a substrate 210 and a dummy die 230. The substrate 210 is a printed circuit board. The substrate 210 has a top surface 211, a bottom surface 212 and an opening 213 passing through the top surface 211 and the bottom surface 212. The dummy die 230 has a top surface with a redistribution layer 231 formed by the integrated circuit manufacturing process and a corresponding exposed bottom surface. A plurality of bumps 232 are formed on the top surface of the dummy die 230 and electrically connect the redistribution layer 231 for electrically connecting the substrate 210. A chip cavity of the chip carrier is formed by the top substrate of the dummy die 230 and the opening 213 of the substrate 210. The bottom surface of the dummy die 230 has a high thermal-conducting metal layer 233, such as gold or copper. The thermal-conducting metal layer 233 is formed by sputtering method for enhancing heat dissipation. At least a semiconductor chip 220 with electrically calculating function is flip-chip mounted onto the top surface of the dummy die 230 inside the chip cavity (opening 213) so that the bumps 221 of the chip 220 are bonded onto the redistribution layer 231 (i.e. flip-chip pads) and electrically connected to the printed circuit board 210 passing through the peripheral connecting pads of redistribution layer 231 and the bumps 232. Therefore, in order to avoid directly flip-chip mounting the chip 220 onto a printed circuit board, the dummy die 230 is used for flip-chip connection of the chip 220 to reach eliminating flip-chip stress of the chip 220, fine pitch flip-chip mounting and thinner flip-chip package. Besides, a packaging body 240 formed after electrically connecting step by dispensing method, then a plurality of solder ball 250 are planted to the bottom surface 212 of the substrate 210.

The above description of embodiments of this invention is intended to be illustrated and not limiting. Other embodiments of this invention will be obvious to those skilled in the art in view of the above disclosure.

What is claimed is:
1. A flip-chip package comprising:
   a) a substrate having:
      i) a top substrate surface;
      ii) a bottom substrate surface; and
      iii) a substrate opening extending through the top surface and the bottom surface;
   b) a dummy die being a silicon substrate having no electrically calculating function, connected to the bottom substrate surface and aligned with the substrate opening, and having a redistribution layer, the redistribution layer having a plurality of flip-chip pads and a plurality of connecting pads connected by an integrated circuit trace, the plurality of flip-chip pads and the plurality of connecting pads are located on a top surface of the dummy die below the substrate opening, the plurality of connecting pads of the redistribution layer are electrically connected to the substrate, wherein the dummy die has an exposed surface located on a bottom thereof, the exposed surface having a metal thermal-conducting layer directly formed thereon to substantially cover the exposed surface located on the bottom of the dummy die, the metal thermal conducting layer beina a non-patterned layer, the metal thermal conducting layer being electrically isolated from the redistribution layer; and
   c) a chip located in the opening and having a plurality of bumps electrically connected to the plurality of flip-chip pads of the redistribution layer.

2. The flip-chip package according to claim 1, further comprising a package body located in the substrate opening and encasing the chip.

3. The flip-chip package according to claim 1, wherein the substrate is a printed circuit board.

4. The flip-chip package according to claim 1, wherein the dummy die has a size larger than a size of the chip.

5. The flip-chip package according to claim 1, wherein each of the plurality of flip-chip pads have a pitch smaller that a pitch of each of the plurality of connecting pads.

6. The flip-chip package according to claim 1, wherein each of the plurality of flip-chip pads have a pitch less than 150 m.

7. The flip-chip package according to claim 1, further comprising a plurality of bonding wires electrically connecting the plurality of connecting pads to the substrate.

8. The flip-chip package according to claim 1, further comprising a plurality of bumps electrically connecting the plurality of connecting pads to the substrate.

9. The flip-chip package according to claim 1, further comprising a plurality of top connection pads located on the top substrate surface.

10. The flip-chip package according to claim 1, further comprising a plurality of solder balls connected to the bottom substrate surface.

11. The flip-chip package according to claim 1, wherein the plurality of top connection pads of a top flip-chip package are connected to the plurality of bottom solder balls of a bottom top flip-chip package.

12. The flip-chip package according to claim 1, further comprising an adhesive tape connecting the dummy die to the bottom substrate surface.

13. The flip-chip package according to claim 1, wherein the substrate opening includes a stair located on an interior circumference thereof.

14. The flip-chip package according to claim 1, wherein the metal thermal-conducting layer is a sputtered metal layer.

* * * * *